(12) United States Patent
Abbey

(10) Patent No.: US 6,232,901 B1
(45) Date of Patent: May 15, 2001

(54) HIGH PERFORMANCE SIGMA-DELTA-SIGMA LOW-PASS/BAND-PASS MODULATOR BASED ANALOG-TO-DIGITAL AND DIGITAL-TO-ANALOG CONVERTER

(75) Inventor: Duane L. Abbey, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 09/384,002

(22) Filed: Aug. 26, 1999

(51) Int. Cl.[7] ................................................ H03M 3/02
(52) U.S. Cl. ................................... 341/143; 341/144
(58) Field of Search ........................... 341/143, 144, 341/155

(56) References Cited

U.S. PATENT DOCUMENTS

| | | | |
|---|---|---|---|
| 5,654,711 | * | 8/1997 | Fujimori ................................. 341/143 |
| 5,682,161 | * | 10/1997 | Ribner et al. ......................... 341/143 |
| 5,757,301 | * | 5/1998 | Kuo et al. .............................. 341/143 |
| 6,061,008 | * | 5/2000 | Abbey .................................... 341/143 |

* cited by examiner

Primary Examiner—Peguy Jeanpierre
(74) Attorney, Agent, or Firm—Nathan O. Jensen; Kyle Eppele; J. P. O'Shaughnessy

(57) ABSTRACT

A sigma-delta low-pass/band-pass based modulator for analog-to-digital converters includes at least one or more tunable band-pass filter stages. The filter stages are configured arrays with one or more parallel filter stages arranged as a group, and with one or more groups in cascade. The input signal is provided to all filter stages in the first group, and the outputs of the last group are combined and provided to the output processing elements. The output processing elements provide the signal conversion to the converter output, as well as the inverse conversion of the output signal to form the feedback signal or signals. All filter stages receive a feedback signal from the output processing elements. Each of the tunable band-pass filter stages is independently tunable to a respective predetermined frequency. At least one of the filter stages can be configured to support low-pass operation in conjunction with band-pass operation for increased low-pass signal bandwidth. The modulator can also be configured as digital-to-analog converters or as digital resolution reducers.

20 Claims, 8 Drawing Sheets

HIGH PERFORMANCE SIGMA-DELTA-SIGMA LOW-PASS/BAND-PASS MODULATOR BASED ANALOG-TO-DIGITAL AND DIGITAL-TO-ANALOG CONVERTER

FIELD OF THE INVENTION

The present invention generally relates to the field of analog-to-digital and digital-to-analog converters, and particularly to sigma-delta-sigma low-pass/band-pass modulator based analog-to-digital and digital-to-analog converters.

BACKGROUND OF THE INVENTION

High performance analog-to-digital converters (ADCs) and digital-to-analog converters (DACs), preferably covering radio frequency carriers directly, can be utilized in communications equipment. Accordingly, there lies a need for frequency and bandwidth tunable ADCs and DACs.

Referring now to FIG. 1, a four-stage sigma-delta-sigma modulator based ADC architecture, which has primarily a low-pass noise-shaping characteristic (i.e., one side of the signal pass band is at DC, and the noise is pushed to frequencies above the highest signal pass band frequency). In each stage of ADC modulator 100, there are 2 sample and hold circuits 110 and 112 used to delay the stage output by one sample clock period and combine it with the stage input, thereby producing a sampled analog integrator. The system of ADC modulator 100 uses discrete time, rather than continuous time integration, for optimum performance in higher order modulators. The modulator loop delay on noise is minimized, thereby allowing for stable operation using higher effective modulator loop gain than would be possible using continuous time integration (particularly in 1-bit output modulators). Using dual latches 114 and 116 after quantizer 118 minimizes the feedback transient responses of DACs 120 and 134 and consequently the stage output transient responses. An isolated critical first stage DAC 120 is shown to minimize undesired stage to stage interaction via feedback path 122. De-multiplexer 124 in one embodiment provides optional serial-to-parallel conversion to reduce the physical data rate where needed (i.e., reduce the data bus rate between the modulator and decimator circuits). The "Gx" and "1-Gx" gain controls $G_1$, $G_2$, $G_3$, $1-G_1$, $1-G_2$, and $1-G_3$ are used to stabilize ADC modulator 100, while at the same time maintaining a flat response to modulator input 126 at modulator data output 128. The C1 and C2 inputs are non-overlapping, two phase sample clocks used to control the timing of the delay elements (i.e., "S/H pairs" and "latch pairs"). The first two stages 130 and 132 of ADC modulator 100 have a feedback gain control term $T_2$ which is used to form a partial resonator at the upper frequency end of the pass band, and thereby effectively increase the pass bandwidth. In effect, part of the high frequency pass band noise is moved to the lower frequencies, which flattens and widens the pass band noise response.

Referring now to FIG. 2, a linearized model of the sigma-delta-sigma modulator shown in FIG. 1 will be discussed. FIG. 2 illustrates how the transfer function of ADC modulator 200 behaves relative to input signal X at input 210 and the quantizer noise $Q_N$. Similar linearized models can be formed and transfer equations derived for other numbers of stages.

T feedback terms can be used around all of the paired sets of stages, thereby mostly eliminating the low-pass noise response and replacing it with a tunable band-pass response. In other words, the noise is moved out of the desired signal bandwidth that is center frequency tunable up in frequency.

A decimation circuit that would be used to recover the desired resolution and reduce the sample rate would in effect utilize tunable digital frequency translation of the signal bandwidth and a fixed digital filter. When ADC modulator 200 is used as a tunable band-pass ADC, the quality factor "Q" (the ratio of the tune frequency to the signal bandwidth) is not constant, but rather decreases as the tune frequency increases. This is not a problem when the tune frequency is low relative to the modulator sample rate, which is the case when used to enhance the low-pass signal bandwidth. However, as the tune frequency approaches the Nyquist rate ($F_S/2$), the noise shaping ability degrades substantially. Thus, there lies a need for a new architecture for a sigma-delta-sigma modulator variation that can provide tunable band-pass performance with constant Q over the sampling band. In such a modulator the noise shaping performance would preferably be basically the same regardless of the tune frequency.

SUMMARY OF THE INVENTION

The present invention is in one embodiment primarily, but not exclusively, directed to an analog-to-digital converter. In one embodiment, the analog-to-digital converter includes at least two or more tunable band-pass filter stages, a first stage of the at least two or more tunable band-pass filter stages receiving an analog input signal and having an output provided to an input of a second stage of the at least two or more band-pass filter stages, a first gain element coupled between the first stage and the second stage for providing a first gain level, a second gain element coupled between the input of the first stage and the input of the second stage for providing a second gain level, and a feedback loop for providing a quantized, delayed and converted to analog version of an output of the second stage to each of the at least two or more tunable band-pass filter stages wherein each of the at least two or more tunable band-pass filter stages is tunable to a respective predetermined frequency.

It is to be understood that both the foregoing general description and the following detailed description are exemplary and explanatory only and are not restrictive of the invention as claimed.

The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiment of the invention, an example of which is illustrated in the accompanying drawings.

Figure 3:
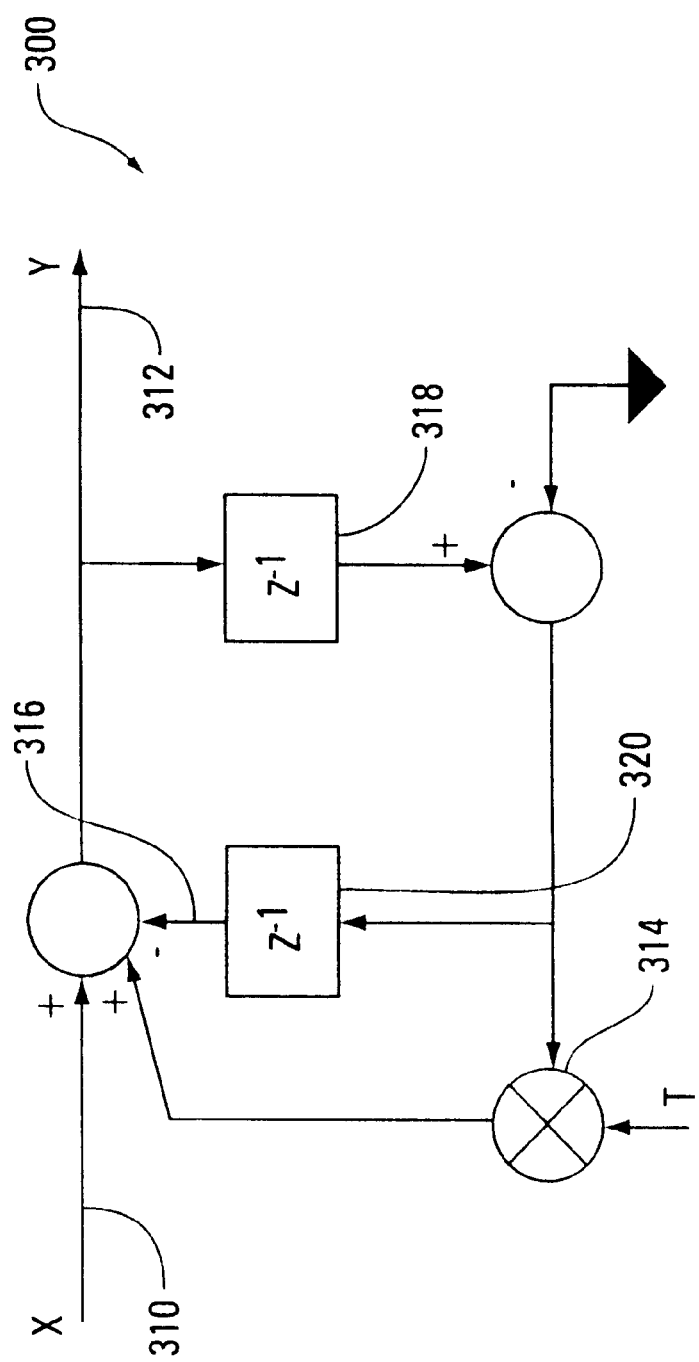
FIG. 3 is a diagram of a tunable band-pass filter stage in accordance with the present invention.

Referring now to FIG. 3, a tunable band-pass filter stage for utilization in a modulator in accordance with the present invention will be discussed. Tunable band-pass filter stage 300 utilizes the same general subcircuits as the low-pass filter stages 130 and 132 of FIG. 1, however tunable band-pass filter stage 300 is capable of producing a tunable constant Q filter response for each stage. The transfer function for tunable band-pass filter stage 300 is as follows:

$$Y=X/[1-TZ^{-1}+Z^{-2l}]$$

$$T=2\cos\theta_s$$

where $\theta_S$=frequency angle relative to the sample rate. If the delay terms are balanced, tunable band-pass filter stage 300 provides a constant Q response.

As shown in Table 1, listing example values of the tune gain element "T" versus tune frequency, $-2 \leq T \leq 2$ tunes the center frequency from Nyquist (Fs/2) down to dc (i.e., 0 Hz).

TABLE 1

Tune Gain Element Values, T, versus Tune Frequency

| T | $\theta_s$, degrees | Frequency |
|---|---|---|
| 0 | 90 | $F_s/4$ |
| 0.5 | 75.5 | $F_s/5$ |
| −0.5 | 104.5 | $3 F_s/10$ |
| 1 | 60 | $F_s/6$ |
| −1 | 120 | $F_s/3$ |
| 1.99 | 5.7 | $2 F_s/125$ |
| 2 | 0 | dc |
| −2 | 180 | $F_s/2$ |

Because of sampling theory, when a tunable band-pass is created at $F_C$, it is also created at $F_S-F_C$, $F_S+F_C$, $2F_S-F_C$, etc. In this way, it would be possible to directly sample an RF signal using an ADC formed from one or more tunable band-pass filter stages 300. When T tap 314 is used, it is preferable that the loop delay 318 from the stage output 312 to tap 314 be equal to the delay 320 $F_C$ from tap 314 to the negative input summer port input 316 in order to maintain constant "Q" performance and predictable T value to $F_C$ relationships.

Figure 4:
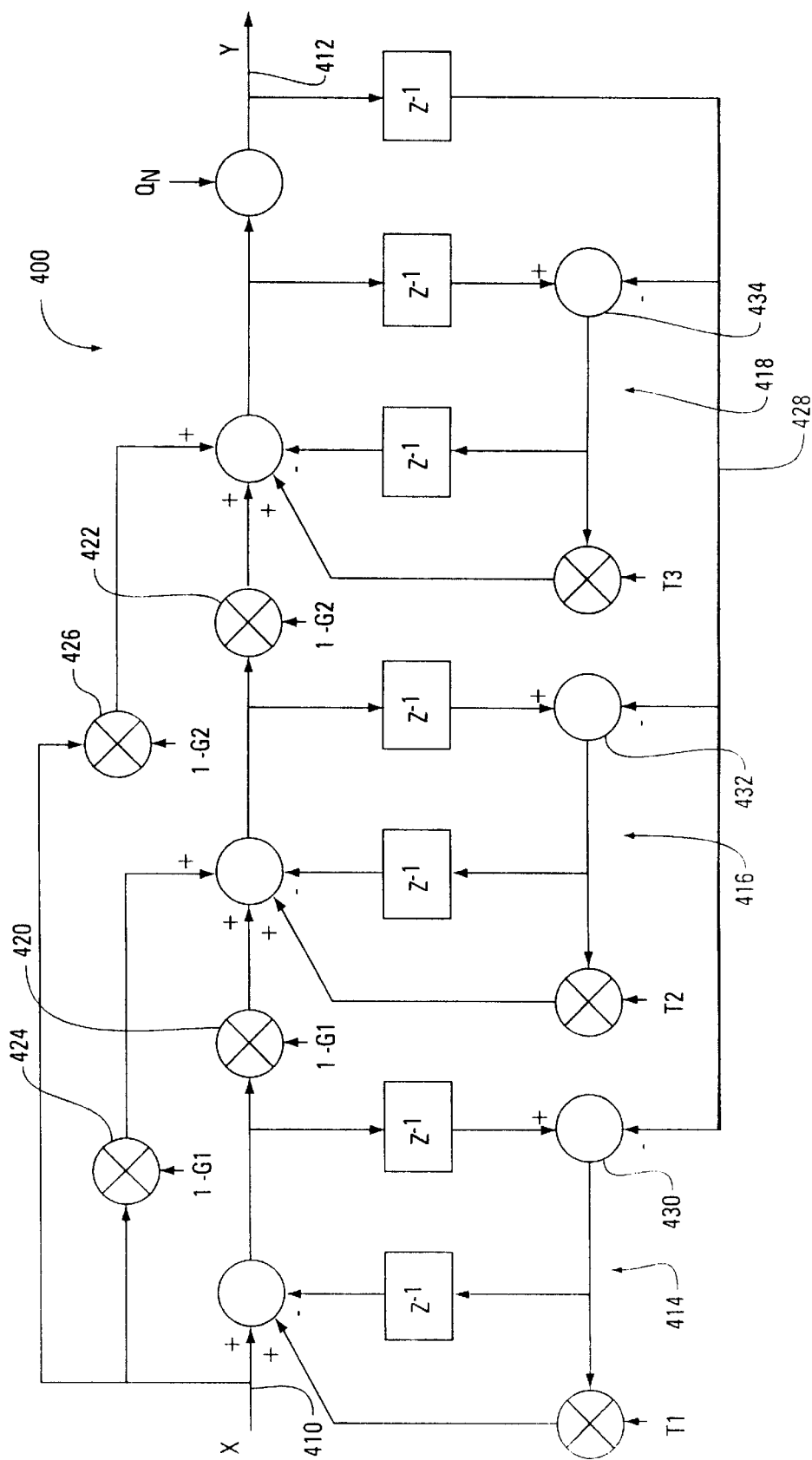
FIG. 4 is a diagram of a linearized three-stage sigma-delta-sigma modulator utilizing band-pass filter stages.

Referring now to FIG. 4, a linearized three-stage sigma-delta-sigma modulator architecture utilizing band-pass filter stages in accordance with the present invention will be discussed. As shown in FIG. 4, modulator 400 comprises three tunable band-pass filter stages 414, 416 and 418 that are the tunable band-pass filter stage 300 connected in cascade. Gain stage 420 is provided between tunable band-pass filter stages 414 and 416, and gain stage 422 is provided between tunable band-pass filter stages 416 and 418. Furthermore, feed-forward gain stage 424 is provided from the input of tunable band-pass filter stage 414 to the input of tunable band-pass filter stage 416, and feed-forward gain stage 426 is provided between the input of tunable band-pass filter stage 414 to the input of tunable band-pass filter stage 418. A quantized and delayed feedback loop 428 is provided from stage output 418 to each stage feedback loop 430, 432 and 434, respectively. The behavior of the transfer function of modulator 400 relative to the input signal X at input 410 and the quantizer noise $Q_N$ for quantizer output signal Y at output 412 is as follows:

$$Y = X + \frac{Q_N[(1-T_1Z^{-1}+Z^{-2})(1-T_2Z^{-1}Z^{-2})(1-T_3Z^{-1}Z^{-2})]}{[1-Z^{-1}(T_2(1-G_2)+T_1(1-G_1G_2))+Z^{-2}(2-G_2-G_1G_2+T_1T_2(1-G_2))-Z^{-3}(T_1+T_2)(1-G_2)+Z^{-4}(1-G_4)]}$$

As $G_1$, $G_2$ go to 1:

$$Y=X+Q_N(1-T_1Z^{-1}+Z^{-2})(1-T_2Z^{-1}+Z^{-2})(1-T_3Z^{-1}+Z^{-2})$$

As $T_1$, $T_2$, $T_3$ go to zero:

$$Y = X + \frac{Q_N(1-Z^{-2})^3}{[1-Z^{-2}(2-G_2(1-G_1))+Z^{-4}(1-G_2)]}$$

As $T_1$, $T_2$, $T_3$ go to zero and $G_1$, $G_2$ go to 1:

$$Y=X+Q_N(1+Z^{-2})^3$$

Similar linearized models can be formed and transfer equations derived for modulators having other numbers of stages. Note that the same $G_X(G_1, G_2)$ and $1-G_X(1-G_1, 1-G_2)$ term stabilization may be utilized with a band-pass modulator as for a low-pass modulator. Any stage can be converted from a band-pass to a low-pass stage by setting the stage's T value to one and the stage's input summer's negative tap to zero (ground). In such and embodiment, combinations of low-pass and band-pass stages can be used to enhance the low-pass bandwidth (e.g., make it wider). Additionally, the T value of each stage may be independently set, so as to combine responses in the desired way in the common modulator data output.

Figure 1:
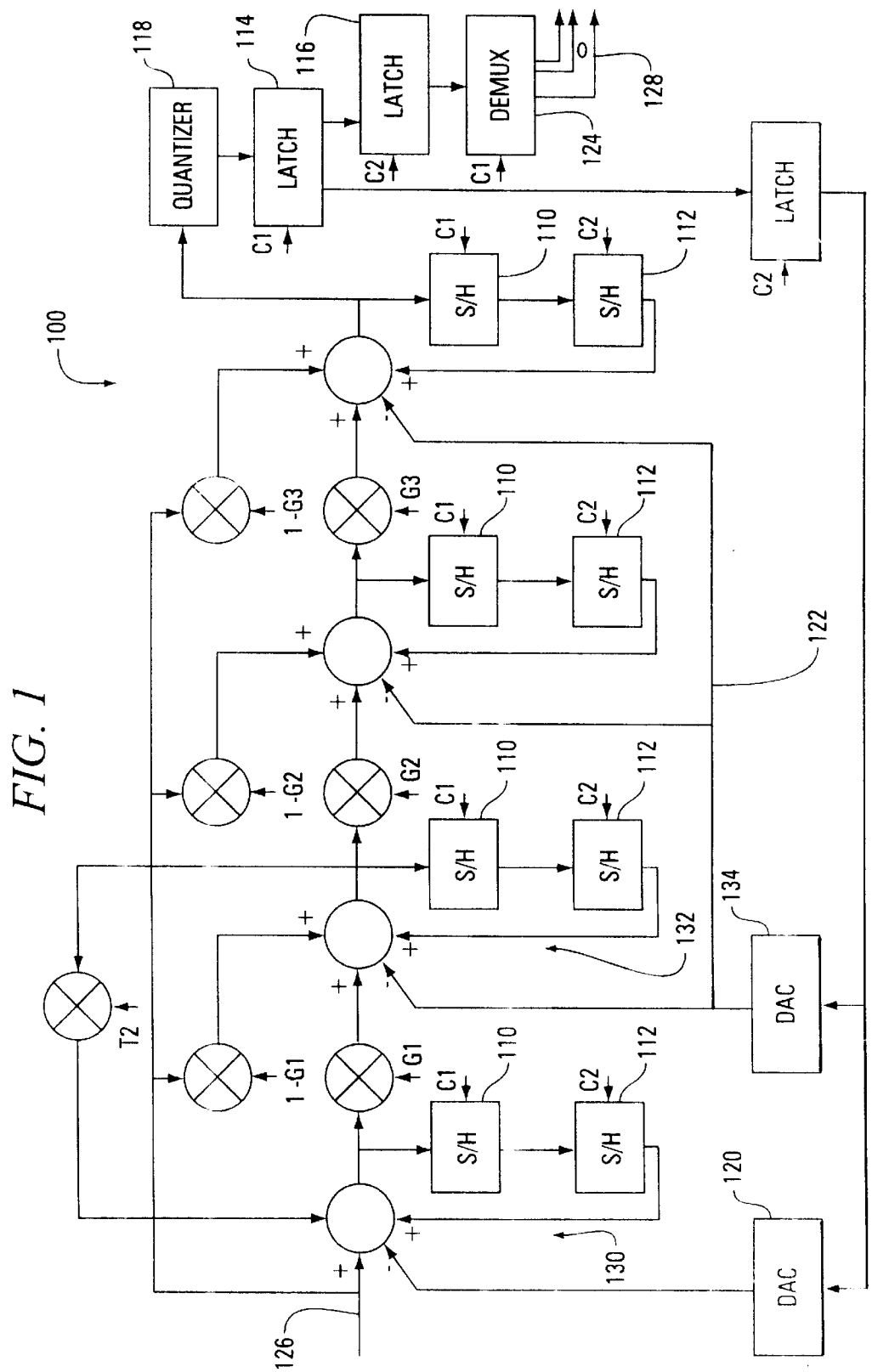
FIG. 1 is a diagram of a four-stage sigma-delta-sigma low-pass modulator based ADC architecture.
Figure 2:
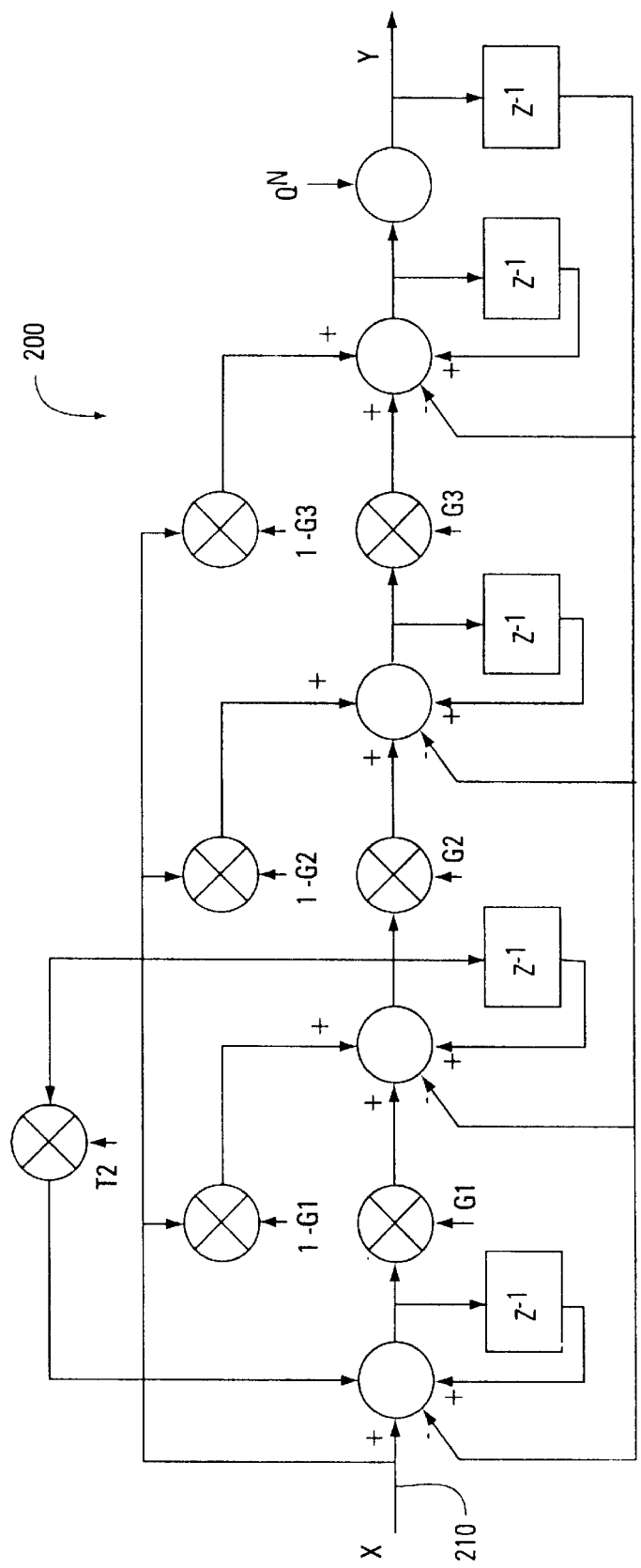
FIG. 2 is a diagram of a linearized version of the sigma-delta-sigma modulator shown in FIG. 1.
Figure 5:
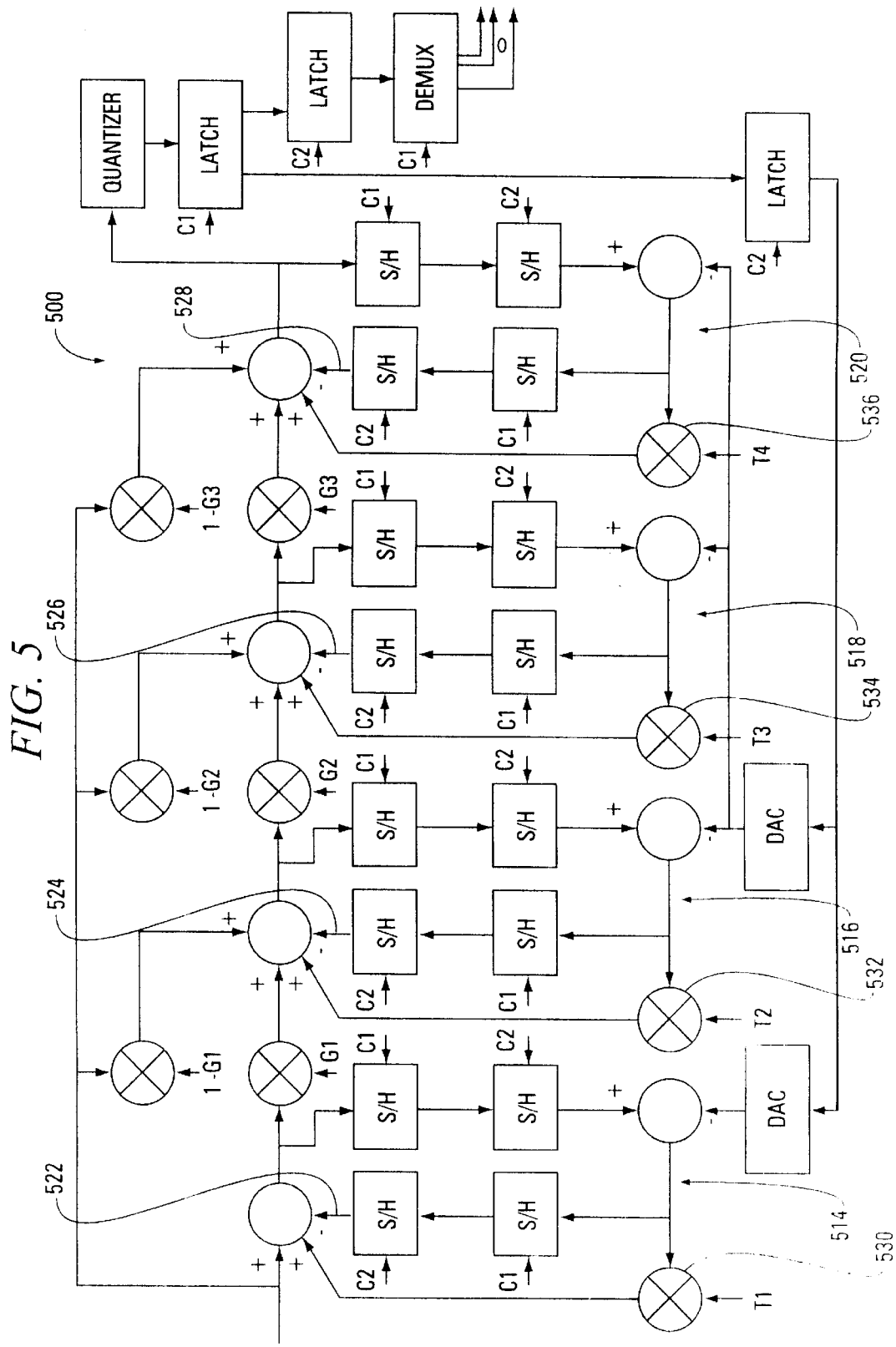
FIG. 5 is a diagram of a band-pass equivalent of the ADC of FIG. 1.

Referring now to FIG. 5, a band-pass equivalent of the ADC of FIG. 1 will be discussed. ADC 500 as shown in FIG. 5 is a four-stage sigma-delta-sigma modulator band-pass ADC. Any one or more stages 514, 516, 518, and 520 of ADC 500 can be configured from a band-pass stage to a low-pass stage, if desired, by setting the corresponding T value 530, 532, 534, or 536, respectively, to one and grounding the negative input summer tap 522, 524, 526, or 528, respectively, for that stage. Because band-pass stages can have Qs of several hundred each, it may be preferable to also control loop gain, thereby trading off increased tuned bandwidth for reduced noise suppression. Providing a programmable level of attenuation in the loop to reduce the Q value ("de-Q") the loop can provide the desired bandwidth versus noise suppression trade-off.

Figure 6:
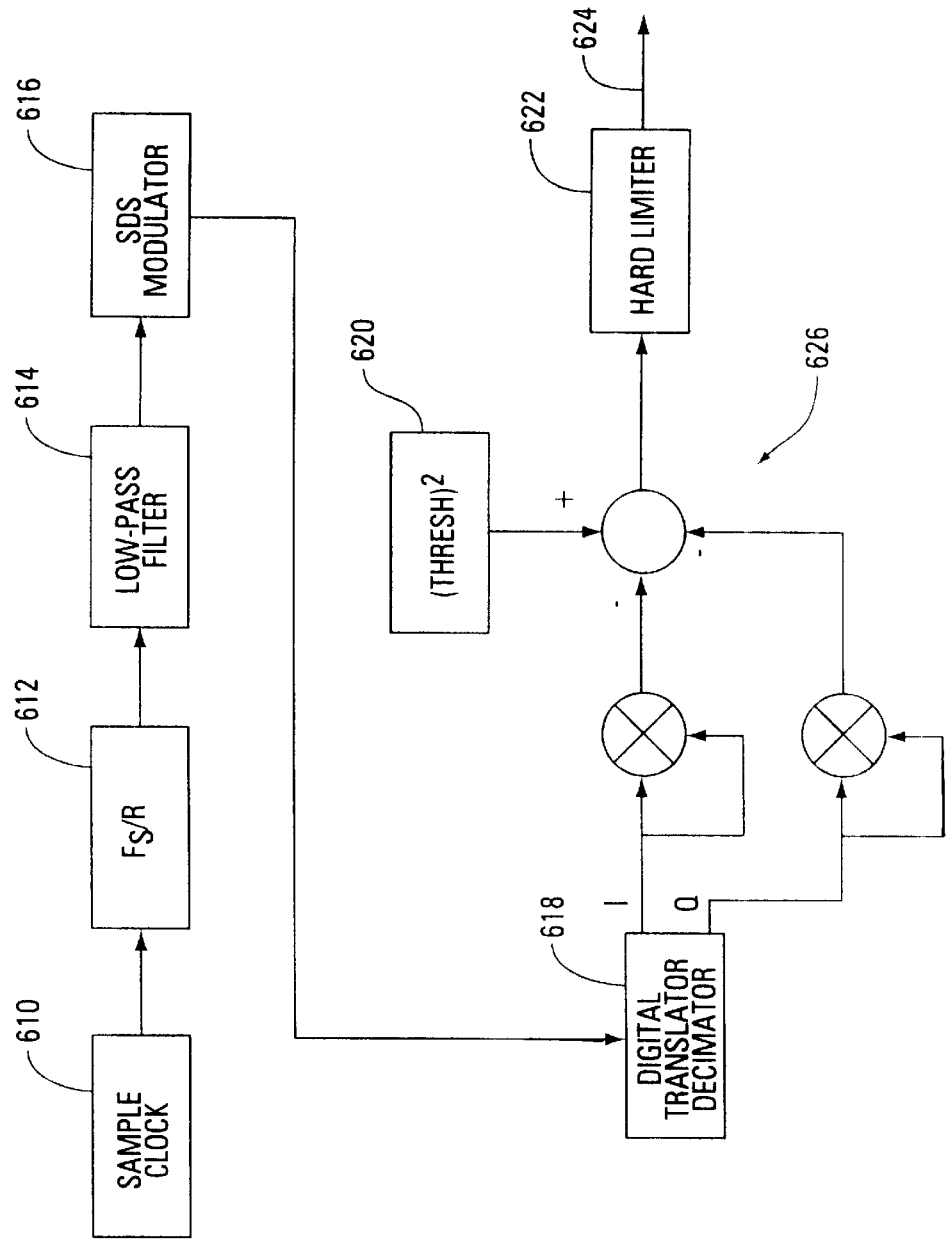
FIG. 6 is a diagram of an exemplary embodiment of configuration for calibrating the tuning frequencies of an ADC modulator of the present invention.

The band-pass architecture of ADC 500 of FIG. 5 is capable of providing high levels of noise suppression in the signal bandwidth when the bandwidth is not overly wide so as to maintain a fairly high over sampling ratio for ADC 500. However, if the value of tolerance on the tune center frequency is not sufficiently low, the noise suppression bandwidth can become skewed with respect to the signal bandwidth. One exemplary embodiment in which the separate stages tune frequencies are calibrated is shown in FIG. 6. As illustrated in FIG. 6, calibration may be performed off-line (i.e., during idle periods). Sample clock 610 is divided down by frequency divider 612 to form a well out-of-band test signal at a frequency below the tuned signal bandwidth that allows modulator 616 to perform normally with respect to noise shaping without the test signal interfering with the performance measurement. Digital translator/decimator (digital band-pass filter) 618 is programmed for the desired center frequency and bandwidth. Observation circuit 626 is utilized to compare the in-band noise level to a programmed threshold 620. The T values of modulator 616 are adjusted for acceptable in-band noise suppression with the low frequency out-of-band tone input provided to modulator 616 by sample clock 610, frequency divider 612 and low-pass filter 614. For positive values at output 624 of hard limiter 622, T values are acceptable; for negative values at output 624 of hard limiter 622, T values are unacceptable and require adjustment. In a preferred embodiment, an on-line automatic frequency control (AFC) configuration may be utilized such that modulator 616 need not be taken off line. In one embodiment thereof, an AFC configuration utilizes upper and lower signal bandwidth edge digital filters (i.e., narrow band edge filters) with similar observation circuits on each filter. T values are adjusted as necessary to force both observations to be acceptable. In an alternative embodiment, extra wide noise suppression bandwidths are provided to compensate for any tune point skewing without requiring the predetermined "T" values to be altered. Thus, higher sample clock rates are utilized to maintain the high over sampling ratios (i.e., the ratio of the sampling frequency to twice the signal bandwidth) required for the extra wide bandwidth.

Figure 7:
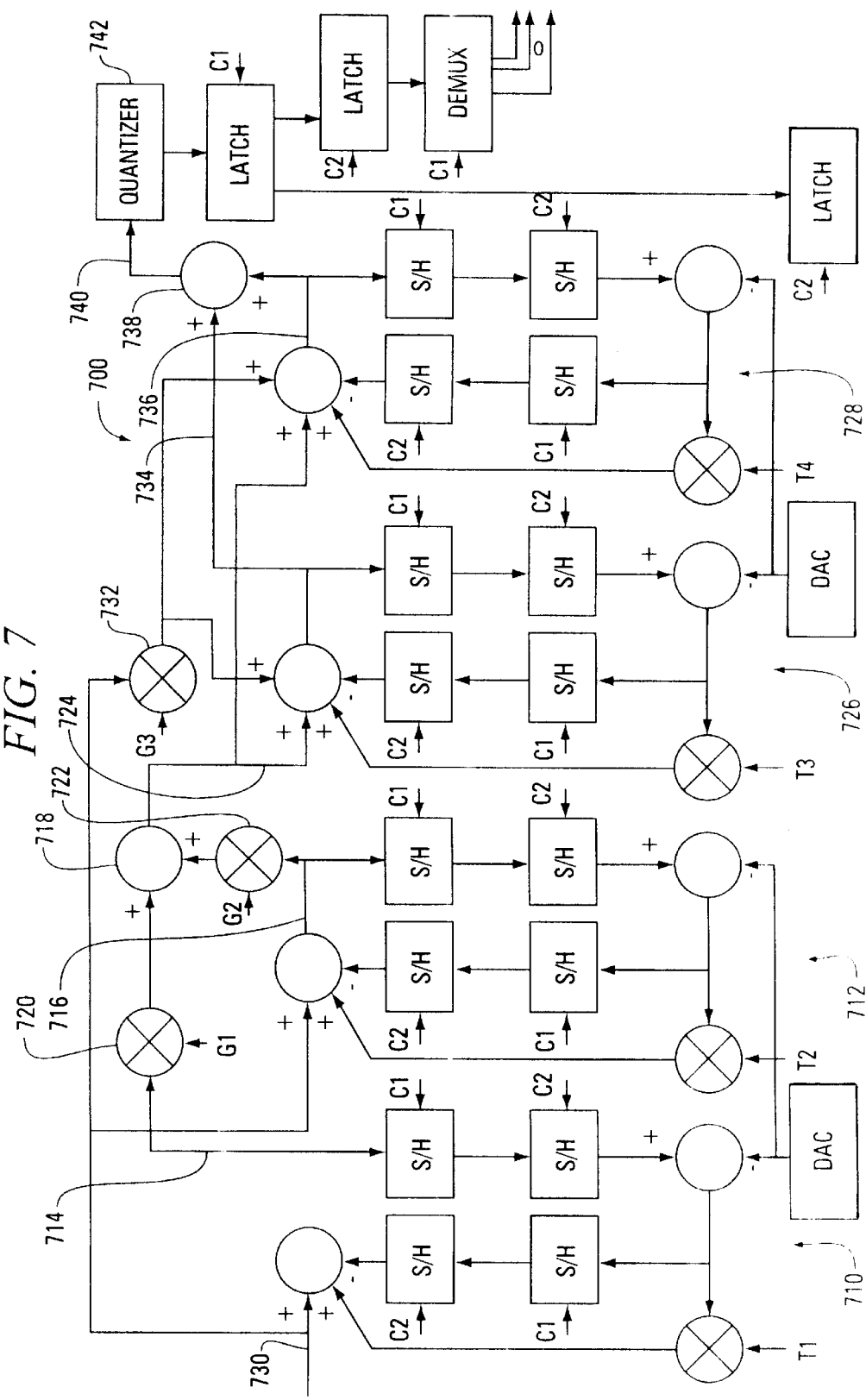
FIG. 7 is a diagram of a two-stage by two-stage array version of the ADC modulator of FIG. 5.

Referring now to FIG. 7, a two-stage by two-stage array version of FIG. 5 will be discussed. In the ADC modulator 700 shown in FIG. 7, there is a parallel dimension and an in-line dimension to the number of stages in the resulting array of stages. The outputs 714 and 716 of first parallel stage set formed by stages 710 and 712, respectively (tuned by $T_1$ and $T_2$ values, respectively) are coupled to summer 718 via gain elements 720 and 722 (having gain values $G_1$ and $G_2$, respectively). The output 724 from summer 718 forms an input for the second parallel stage set formed by stages 726 and 728, respectively (tuned by $T_3$ and $T_4$ values). Input signal 730 of ADC modulator 700 is fed forward through gain element 732 (having gain value $G_3$) to the second stage set formed by stages 726 and 728 and provides a (1−(G1+G2)) function as a stabilization network. Outputs 734 and 736 of the second stage set are summed at summer 738 to form an input 740 for quantizer 742. The architecture of ADC modulator shows one embodiment and is not limited to 2×2 but may be alternatively constructed in numerous arrays (i.e., 3×3, 2×3, 3×2, 4×4, 4×2, 5×2, 6×2, etc, or non-rectangular arrays such as 1+2, 2+3, 2+4, 1+2+4, etc.).

Figure 8:
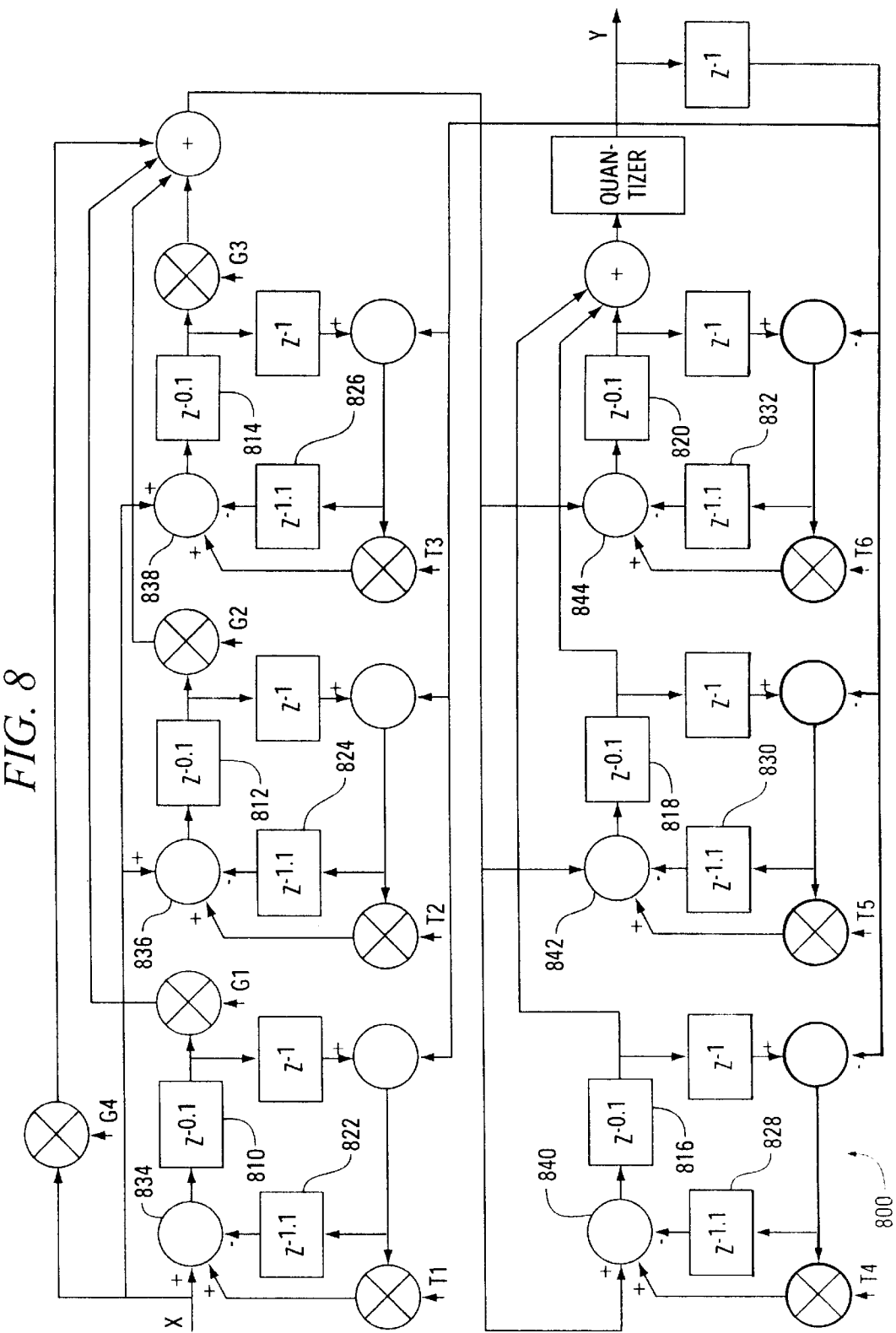
FIG. 8 is a diagram of an ADC modulator having a 3×2 array architecture in accordance with the present invention.

Referring now to FIG. 8, an ADC modulator having a 3×2 array architecture in accordance with the present invention will be discussed. The benefit potential of ADC modulator 800, a sigma-delta-sigma band-pass modulator, is that there is significantly more flexibility with respect to relative stage tune point placement. Noise suppression nulls are capable of being grouped together to make wider tuned bandwidths. Band-pass noise suppression nulls may be grouped with low-pass noise suppression to form excellent low-pass performance at very low oversampling rates. Further, noise suppression nulls are capable of being separated into subgroups, each subgroup forming a separate band-pass, the combination of which being capable of spanning the sampling band simultaneously. When the architecture of ADC modulator 800 is combined with a multi-bit quantizer and at least one or more linear feedback DACs, the noise suppression performance is expected to improve substantially over single-bit quantizer implementations for all embodiments thereof. FIG. 8 shows the addition of stage delays 810, 812, 814, 816, 818 and 820 ($Z^{-0.1}$), indicative of a finite (non-zero) input summer 834, 836, 838, 840, 842 and 844 delay, respectively. To compensate for these added delays, delays 822, 824, 826, 828, 830 and 832 are increased from $Z^{-1}$ to $Z^{-1.1}$. In this way the stages can be rebalanced to maintain the desired constant Q performance. It has been determined that a two-stage deep array is preferred with increasing numbers of stages being applied to the parallel array dimension. Embodiments of ADC modulator 800 having three or more stages in the array depth provide higher tune point accuracy capable of being maintained by way of an AFC configuration, for example. Alternatively, stage assets may be utilized to provide greater flexibility in creating wider signal bandwidths, by way of increased numbers of stages in the parallel dimension, that are not required to be accurately tune controlled.

All of the described embodiments of sigma-delta-sigma modulators, as applied to high performance ADCs, including FIGS. 1, 2, 4, 5, 7, and 8, can be applied to high performance DACs and to digital resolution reducers. A digital resolution reducer allows for reducing the number of bits in a digital signal, in the case of oversampled signals, without decreasing the signal to quantization noise ratio. The digital resolution reducer, as well as the ADCs and DACs, reshape the noise floor to maintain high performance in the signal band-pass. A resolution reducer may be formed by replacing the sample-and-hold circuits (S/Hs) in the ADC (e.g., 110, 112, etc. of ADC 100) with latches, the quantizer with a resolution rounder (reducer), and the DACs with resolution expanders. DACs are formed by replacing S/H circuits in the ADC with latches, replacing the quantizer with a resolution rounder and DAC combination, replacing the latches with S/H circuits, and replacing the DACs with quantizer and resolution expander combinations.

It is believed that the high performance sigma-delta-sigma modulator based analog-to-digital and digital-to-analog converter of the present invention and many of its attendant advantages will be understood by the foregoing description, and it will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

What is claimed is:

1. An apparatus, comprising:
   at least one or more tunable band-pass filter stages in cascade, a first stage receiving an input signal at an input of the apparatus, a last stage providing an output to an output processor;
   a first set of interstage gain elements, one each being coupled between each of said at least one or more tunable band-pass filter stages;
   a second set of gain elements, one each being coupled between an input of said first stage and each succeeding one of said at least one or more tunable band-pass filter stages;
   said output processor for providing signal conversion at an output of the apparatus, and for inverse conversion for one or more feedback outputs; and a feedback loop coupling one or more feedback output signals of the apparatus to each of said at least one or more tunable band-pass filter stages wherein each of said at least one or more tunable band-pass filter stages is tunable to a respective predetermined frequency.

2. An apparatus as claimed in claim 1, at least one of said at least one or more tunable band-pass filter stages comprising an input summer for receiving an input signal, a tuning element for providing a tuning signal to said input summer, a first delay element coupled from an output of said input summer to a feedback summer for receiving a feedback signal, an output of said feedback summer being coupled to said tuning element whereby a first delay loop is provided, and a second delay element coupled from the output of said feedback summer to an input of said input summer whereby a second delay loop is provided.

3. An apparatus as claimed in claim 2, wherein a total signal delay of said second delay loop is equal to twice a total signal delay of said first delay loop such that performance of the apparatus if optimized.

4. An apparatus as claimed in claim 1, at least one said at least one or more tunable band-pass filter stages being configurable to provide a low-pass filter response.

5. An apparatus as claimed in claim 1, said output processor including a quantizer coupled from an output of the last filter stage through a clocked delay element to the output of the apparatus, the output of said quantizer being coupled back through one or more digital-to-analog converters to the one or more feedback signal outputs, one of said one or more feedback signal outputs per each of the one or more digital-to-analog converters.

6. An apparatus as claimed in claim 1, said output processor including a resolution reducer and a digital-to-analog converter in combination, said combination being coupled from the output of said last filter stage through a clocked delay element to the output of the apparatus, the output of the apparatus being coupled through a quantizer and one or more resolution expander combinations to the one or more feedback signal outputs, one output of the one or more feedback signal outputs per resolution expander.

7. An apparatus as claimed in claim 1, said output processor included a resolution reducer coupled from the output of said last filter stage through a clocked delay element to the output of the apparatus, the output of the apparatus being coupled through one or more resolution expanders to the one or more feedback signal outputs, one output of the one or more feedback signal outputs per resolution expander.

8. An apparatus as claimed in claim 1, a digital output of the apparatus being coupled through a demultiplexer for reducing a digital data bus rate for serial-to-parallel conversion of digital output samples.

9. An apparatus, comprising:
an array of at least one or more tunable band-pass filter stages in parallel groups, all stage outputs of said array being summed to a single group output and at least one or more parallel groups in cascade, a first parallel group receiving an input signal at all stage inputs, a last parallel group providing an output to an output processor;
a first set of interstage group gain elements, one each being coupled between an output of each of said at least one or more tunable band-pass filter stages and an output summer of each group, respectively;
a second set of gain elements, one each being coupled between the input of the apparatus and an input of each succeeding one of said at least one or more tunable band-pass filter stages in the cascaded group;
an output processor for providing signal conversion at an output of the apparatus and for providing inverse conversion for one or more feedback outputs; and
a feedback loop coupling the one or more feedback output signals to each of said at least one or more tunable band-pass filter stages wherein each of said at least one or more tunable band-pass filter stages is tunable to a respective predetermined frequency.

10. An apparatus as claimed in claim 9, at least one or said at least one or more tunable band-pass filter stages in parallel groups comprising an input summer for receiving an input signal, a tuning element for providing a tuning signal to said input summer, a first delay element coupled from an output of said input summer to a feedback summer for receiving a feedback signal input, an output of said feedback summer being coupled to said tuning element whereby a first delay loop is provided, and a second delay element coupled from an output of said feedback summer to an input of said input summer whereby a second delay loop is provided.

11. An apparatus as claimed in claim 10, wherein a total signal delay of said second delay loop is equal to twice a total signal delay of said first delay loop whereby performance of the apparatus is optimized.

12. An apparatus as claimed in claim 9, at least one of said at least one or more tunable band-pass filter stages in parallel groups being configurable to provide a low-pass filter response.

13. An apparatus as claimed in claim 9, said output processor including a quantizer coupled from the output of the last filter stage parallel group through a clocked delay element to the output of the apparatus, the output of the apparatus being coupled back through one or more digital-to-analog converters to the one or more feedback signal outputs, one output of the one or more feedback signal outputs per digital-to-analog converter.

14. An apparatus as claimed in claim 9, said output processor including a resolution reducer and digital-to-analog converter combination coupled from an output of the last filter stage parallel group through a clocked delay element to the output of the apparatus, the output of the apparatus being coupled through a quantizer and one or more resolution expander combinations to the one or more feedback signal outputs, one output of the one or more feedback signal outputs per resolution expander.

15. An apparatus as claimed in claim 9, further comprising a resolution reducer coupled from an output of the last filter stage parallel group through a clocked delay element to the output of the apparatus, the output of the apparatus being coupled through one or more resolution expanders to the one or more feedback signal outputs, one output of the one or more feedback signal outputs per resolution expander.

16. An apparatus as claimed in claim 9, a digital output of the apparatus being coupled through a demultiplexer to reduce a digital data bus rate for providing serial-to-parallel conversion of digital output samples.

17. An apparatus, comprising:
at least one or more means for providing a tunable band-pass filter function in cascade, a first one of a said at least one or more tunable band-pass filter function providing means receiving an input signal at an input of the apparatus, a last one of said at least one or more tunable band-pass filter function providing means providing a first output;
a first set of means for providing an adjustable gain level, one of said first set of adjustable gain level providing means being coupled between each of said at least one or more tunable band-pass filter function providing means, respectively;

a second set of means for providing an adjustable gain level, one of said second set of adjustable gain level providing means being coupled between an input of the first one of said at least one or more tunable band-pass filter function providing means and an input of a succeeding one of said at least one or more tunable band-pass filter function providing means, respectively;

processing means, coupled between the first output and an output of the apparatus, for processing a signal for signal conversion, and for providing inverse conversion for one or more feedback outputs; and means for feeding back a signal, said feedback means coupling the one or more feedback outputs to each of said at least one or more tunable band-pass filter function providing means, respectively, wherein each of said at least one or more tunable band-pass filter function providing means is tunable to a respective predetermined frequency.

18. An apparatus as claimed in claim 17, the apparatus being configured to implement an analog-to-digital converter.

19. An apparatus as claimed in claim 17, the apparatus being configured to implement a digital-to-analog converter.

20. An apparatus as claimed in claim 17, the apparatus being configured to implement a digital resolution reducer.

* * * * *